(12) United States Patent
Loomis et al.

(10) Patent No.: US 10,527,239 B1
(45) Date of Patent: Jan. 7, 2020

(54) DECORATIVE LIGHTING ELEMENT HAVING A DIFFUSER BETWEEN AN LED AND A TRANSPARENT LENS

(71) Applicant: Seasons 4, Inc., Toano, VA (US)

(72) Inventors: Jason Loomis, Decatur, GA (US); Jared William Everline, Atlanta, GA (US)

(73) Assignee: Seasons 4, Inc., Toano, VA (US)

( * ) Notice: Subject to any disclaimer, the term of this patent is extended or adjusted under 35 U.S.C. 154(b) by 0 days.

(21) Appl. No.: 16/237,437

(22) Filed: Dec. 31, 2018

Related U.S. Application Data (63) Continuation-in-part of application No. 16/026,835, filed on Jul. 3, 2018.

(51) Int. Cl.
| F21S 4/10 | (2016.01) |
| G02B 5/02 | (2006.01) |
| F21V 23/00 | (2015.01) |
| F21K 9/69 | (2016.01) |

(52) U.S. Cl.
CPC ............. *F21S 4/10* (2016.01); *F21K 9/69* (2016.08); *F21V 23/001* (2013.01); *G02B 5/0205* (2013.01)

(58) Field of Classification Search
CPC . F21S 4/10; F21K 9/69; F21V 23/001; G02B 5/0205
USPC .................................................... 362/249.16
See application file for complete search history.

(56) References Cited

U.S. PATENT DOCUMENTS

| 6,296,376 | B1* | 10/2001 | Kondo | F21V 5/02 362/310 |
| 6,811,283 | B1* | 11/2004 | Kovacs | A47G 33/0836 362/235 |
| 7,222,994 | B2* | 5/2007 | Marra | F21V 5/002 362/268 |
| 7,878,688 | B2* | 2/2011 | Paulussen | F21V 13/02 362/184 |
| 8,220,970 | B1* | 7/2012 | Khazi | F21V 29/004 362/294 |
| 2003/0031013 | A1* | 2/2003 | Tsai | F21S 4/10 362/227 |
| 2004/0066645 | A1* | 4/2004 | Graf | C08L 69/00 362/629 |
| 2009/0046459 | A1* | 2/2009 | Ijzerman | F21V 7/06 362/240 |

(Continued)

*Primary Examiner* — Bryon T Gyllstrom
(74) *Attorney, Agent, or Firm* — Kinney & Lange, P.A.

(57) ABSTRACT

Apparatus and associated methods relate to an LED-based lighting element configured to emulate a glass-bulb filament light. The lighting element has a diffuser between an LED and a transparent lens. The LED emits light of a predetermined color in an emission pattern having a preferential direction of emission. The diffuser receives the light emitted according to the emission pattern and scatters the received light according to a diffusion pattern, thereby reducing the light projected in the preferential direction. The diffuser has an absorption coefficient that is substantially constant throughout the visible spectrum so as not to substantially change the predetermined color of the emitted light as it is scattered by the diffuser. The transparent lens is configured to receive the light scattered by the diffuser and to transmit the received light therethrough.

19 Claims, 6 Drawing Sheets

(56) References Cited

U.S. PATENT DOCUMENTS

| | | | |
|---|---|---|---|
| 2011/0227487 A1* | 9/2011 | Nichol | G02B 6/0018 |
| | | | 315/158 |
| 2014/0226317 A1* | 8/2014 | Livesay | H01L 33/641 |
| | | | 362/147 |
| 2014/0369030 A1* | 12/2014 | Livesay | H01L 33/642 |
| | | | 362/147 |
| 2015/0102731 A1* | 4/2015 | Altamura | H05B 33/0821 |
| | | | 315/152 |

* cited by examiner

DECORATIVE LIGHTING ELEMENT HAVING A DIFFUSER BETWEEN AN LED AND A TRANSPARENT LENS

CROSS-REFERENCE TO RELATED APPLICATION(S)

This application is a continuation-in-part of U.S. application Ser. No. 16/026,835 filed Jul. 3, 2018 for "Decorative Lighting Element Having a Diffuser between an LED and a Transparent Lens" by J. Loomis and J. Everline, which is incorporated herein by reference.

BACKGROUND

Decorative light strings are used to communicate a joy of a holiday season, to draw attention to merchandise, or to simply decorate or adorn an object. Decorative light strings can be used both indoors and outdoors. Decorative light strings have been used residentially to adorn trees, shrubs, and houses. Commercial businesses can use decorative light strings to provide festive atmospheres at their places of business.

Decorative light strings have traditionally used glass-bulb filament lights as individual lighting elements. Such glass-bulb filament lights emit light through a glass bulb in an emission pattern that is substantially uniform in all directions. In recent years, Light Emitting Diodes (LEDs) have used more frequently in decorative light strings. LEDs, however emit light in an emission pattern that is not particularly uniform in all directions. The emission pattern of LEDs can have a strong preferential direction for emission. As such, the perceived light intensity is dependent on the orientation of the lighting element. Thus, some lighting elements may appear to have a much larger intensity than other lighting elements.

To remedy this non-uniform emission pattern of LED-based lighting elements, diffusing lens can be used. Such diffusing lenses scatter the light emitted by the LED, so as to reduce the intensity of the light projected in the preferential direction, and to increase the light projected in non-preferential directions. Such diffusers, however, have a frosted look and do not appear like the clear glass bulbs that have been traditionally used in decorative light strings.

SUMMARY

Apparatus and associated methods relate to a lighting element for a decorative lighting display. The lighting element includes a Light-Emitting Diode (LED) configured to emit light of an emission spectrum corresponding to a predetermined color. The LED is further configured to emit light according to an emission pattern with a preferential direction of emission. The preferential direction of emission is the direction corresponding to a maximum of the emission pattern. The lighting element includes a diffuser coupled to the LED and configured receive the light emitted according to the emission pattern and to scatter the received light according to a diffusion pattern. The light scattered in the preferential direction according to the diffusion pattern is less than 80% of the light emitted in the preferential direction according to the emission pattern. The diffuser has an absorption coefficient that is substantially constant throughout the emission spectrum so as not to substantially change the predetermined color of the emitted light as it is scattered by the diffuser. The substantially constant absorption coefficient is within +/−0.1 throughout the emission spectrum corresponding to the predetermined color. The lighting element also includes a transparent lens coupled to the diffuser so as to receive the light scattered by the diffuser and to transmit the received light therethrough.

Some embodiments relate to a decorative LED light string that includes a plurality of lighting elements distributed along the decorative light string. Each of the plurality of lighting elements includes a Light-Emitting Diode (LED) configured to emit light of a predetermined color. The LED is further configured to emit light according to an emission pattern with a preferential direction of emission. The preferential direction of emission being the direction corresponding to a maximum of the emission pattern. Each of the plurality of lighting elements includes a diffuser coupled to the LED and configured receive the light emitted according to the emission pattern and to scatter the received light according to a diffusion pattern. The light is scattered in the preferential direction according to the diffusion pattern being less than 80% of the emitted light in the preferential direction according to the emission pattern. The diffuser has an absorption coefficient is substantially constant throughout the emission spectrum so as not to substantially change the predetermined color of the emitted light as it is scattered by the diffuser. The substantially constant absorption coefficient is within +/−0.1 throughout the emission spectrum corresponding to the predetermined color. Each of the plurality of lighting elements also includes a transparent lens coupled to the diffuser so as to receive the light scattered by the diffuser and to transmit the received light therethrough.

DETAILED DESCRIPTION

Apparatus and associated methods relate to an LED-based lighting element configured to emulate a glass-bulb filament light. The lighting element has a diffuser between an LED and a transparent lens. The LED emits light of a predetermined color in an emission pattern having a preferential direction of emission. The diffuser receives the light emitted according to the emission pattern and scatters the received light according to a diffusion pattern, thereby reducing the light projected in the preferential direction. The diffuser has an absorption coefficient that is substantially constant throughout the visible spectrum so as not to substantially change the predetermined color of the emitted light as it is scattered by the diffuser. The transparent lens is configured to receive the light scattered by the diffuser and to transmit the received light therethrough.

Figure 1:
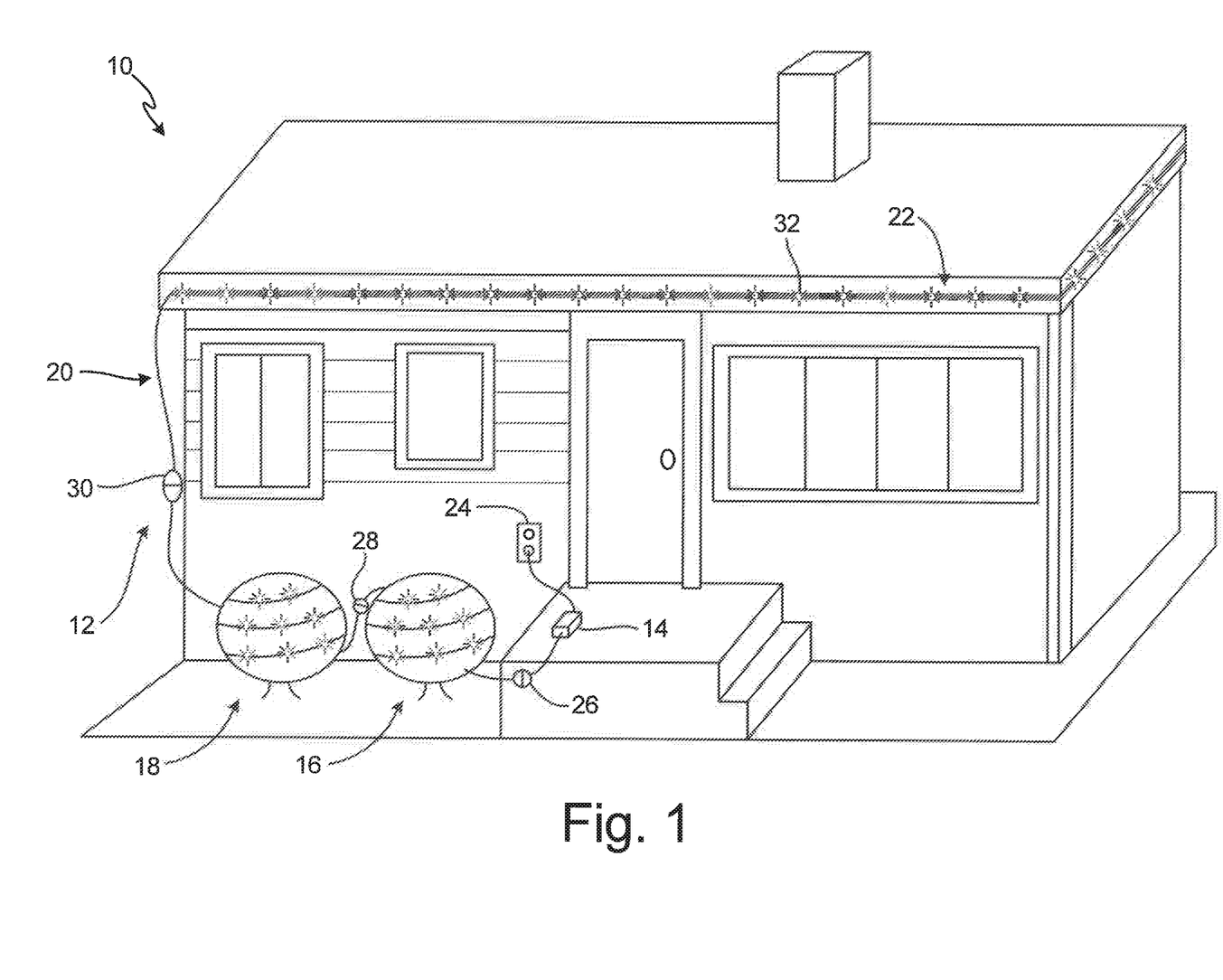
FIG. 1 is a schematic view of a home decorated with series-connected decorative LED light strings having substantially omnidirectional brightness uniformity.

FIG. 1 is a schematic view of a home decorated with series-connected decorative LED light strings having substantially omnidirectional brightness uniformity. In FIG. 1, home 10 is decorated with lighting system 12 for a holiday season. Lighting system 12 includes a power supply 14 and decorative LED light strings 16, 18, 20 and 22 of substantially omnidirectional brightness uniformity. Power supply 14 is plugged into house outlet 24 and draws operating current from standard AC line voltage (e.g., 120 VAC). Decorative light strings 16, 18, 20 and 22 are series connected. First decorative LED light string 16 is connected to power supply 14 via connector pair 26. Second decorative LED light string 18 is connected to first decorative LED light string 16 via connector pair 28. Third decorative LED light string 20 is connected to second decorative LED light string 18 via connector pair 30. Fourth decorative LED light string 22 is connected to third decorative LED light string 20 via connector pair 32. Each of connector pairs 26, 28, 30 and 32 include a connector coupled to a first of the connected elements (e.g., a connector of power supply 14), and a complementary connector coupled to a second of the connected elements (e.g., a connector of first decorative light string 16).

Each of decorative LED light strings 16, 18, 20 and 22 has a plurality of lighting elements. Each of the plurality of lighting elements emits light of an emission spectrum corresponding to a predetermined color. In some embodiments, each of the plurality of lighting elements is a color-controllable lighting element. Each of the plurality of lighting elements has a diffuser and a transparent lens configured to emulate a glass-bulb filament light. Such emulation includes providing substantially omnidirectional light projection through a clear or transparent lens. Such omnidirectional light projection can be achieved using a combination of diffusion and refraction as will be described below.

Operating power for decorative LED light strings 16, 18, 20 and 22 is provided by power supply 14. In some embodiments, power supply 14 converts power from standard AC line voltage to a form compatible with LED light strings 16, 18, 20 and 22. For example, in an exemplary embodiment power supply 14 converts 120 VAC power to high-voltage DC power. In other embodiments, however, decorative light strings 16, 18, 20 and 22 can be made to be compatible with 120 VAC. In such embodiments, power supply 14 can be omitted, and first decorative LED light string 16 can be directly plugged into house outlet 24. Regardless of the specific power configuration, the chain of series-connected decorative LED light strings 16, 18, 20 and 22 is supplied operating power, both voltage and current, through the connector of connector pair 26 that is coupled to first decorative LED light string 16.

All operating current for decorative LED light strings 16, 18, 20 and 22 will be conducted through connector pair 26 in lighting system 12 as depicted in FIG. 1. Connector pair 28 will conduct operating current for decorative LED light strings 18, 20 and 22. Connector pair 30 will conduct operating current for decorative LED light strings 20 and 22. Connector pair 32 will conduct operating current only for decorative LED light strings 22. Operating power for decorative LED light strings 16, 18, 20 and 22 is calculated as the product of the operating voltage and the operating current. Thus, a specific operating power can be achieved using different voltages and currents. For example, a first power configuration may use high operating current and low operating voltage to achieve a specific operating power, while a second power configuration may use a lower operating current a higher operating voltage.

Although both the first and second power configurations achieve the same operating power, the current differences can have secondary consequence. Because the operating current for light strings 16, 18, 20 and 22 is conducted through connector pair 26, a voltage drop will occur across connector pair 26, as connector pair 26 has a non-zero parasitic resistance associated with connector pair 26. Furthermore, a voltage drop will occur across both decorative LED light sting 16 and connector pair 28 due to parasitic resistances, as a result of conduction therethrough of operating current for lights strings 18, 20 and 22. The first power configuration, which achieves the specific operating power using high operating currents will have larger voltage drops across lighting elements 26, 16, 28, etc. than will the second power configuration which achieves the same specific operating power but uses lower operating currents. Use of high-voltage/low-current power configurations can permit the use of long chains of series-connected decorative LED light strings.

Figure 2:
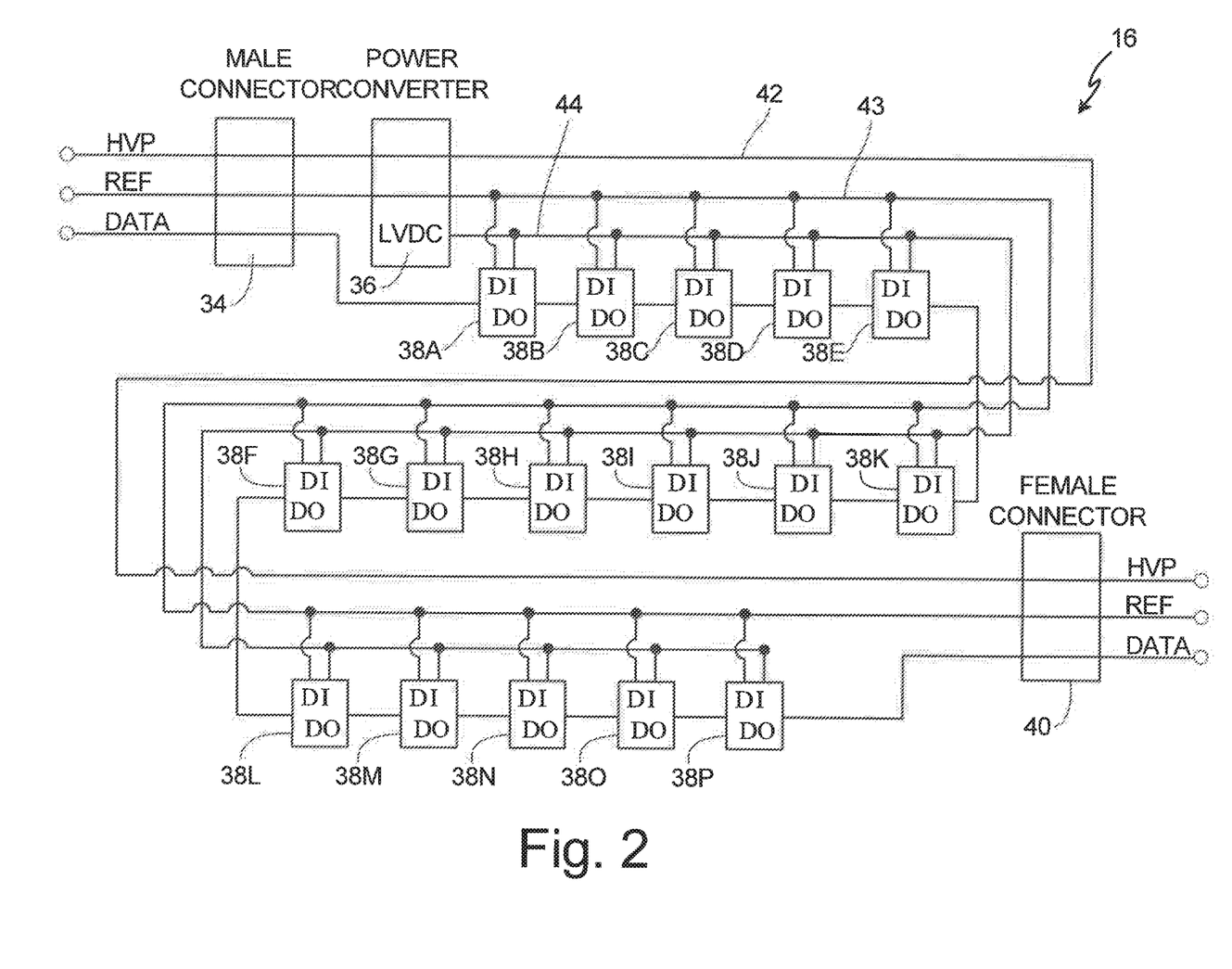
FIG. 2 is a schematic diagram of an exemplary decorative LED light string having independently color-controllable lighting elements.

FIG. 2 is a schematic diagram of an exemplary decorative LED light string having independently color-controllable lighting elements. In FIG. 2, decorative LED light string 16 of FIG. 1 is shown in schematic form. Decorative LED light string 16 includes first connector 34, power converter 36, lighting elements 38A-38P, and second connector 40. First connector 34 is labeled as MALE CONNECTOR, and second connector 40 is labeled as FEMALE CONNECTOR in the depicted embodiment. Various embodiments can have various configurations of connectors. To facilitate series connectivity of multiple decorative LED light stings, however, first connector 34 and second connector 40 are complementary connectors. Connectors are complementary when they mate or engage with one another. Thus, first connector 34 of a subsequent and decorative LED light string (and perhaps identical to decorative LED light string 16, e.g., decorative light string 18 depicted in FIG. 1) can mate or engage with second connector 40 of decorative LED light string 16 depicted in FIGS. 1 and 2, if first connector 34 and second connector 40 are complementary to one another.

In the depicted embodiment connectors 34 and 40 each has three contacts. First connector 34 has contacts labeled: i) high-voltage power HVP; ii) power reference REF; and iii) and data-in DATA. Second connector 40 has contacts labeled: i) high-voltage power HVP; ii) power reference REF; and iii) data-out DATA. Contacts HVP and REF of first connector 34 receive operating power for decorative LED light string 16. Conductors 42 and 43 provide electrical conduction of the received operating power to both power converter 36 and second connector 40. Second connector 40 thereby provides operating power to one or more additional decorative LED light string attached thereto.

Power converter 36 converts the received high-voltage power to a low-voltage DC power suitable for consumption by lighting elements 38A-38P. In some embodiments, the received high-voltage power is 120 VAC line power. In such embodiments, power converter 36 converts the received 120 VAC line power to the low-voltage DC power suitable for consumption by lighting elements 38A-38P. In some embodiments, the received high-voltage power is a high-voltage DC power. For example, in an exemplary embodiment, power supply (depicted in FIG. 1) converts 120 VAC line power to high-voltage DC power by rectifying and filtering the 120 VAC line power. In such embodiments, power converter 36 converts the received high-voltage DC power to the low-voltage DC power suitable for consumption by lighting elements 38A-38P. In still other embodiments, power converter 36 is configured to convert power from other high-voltage power specifications to the low-voltage DC power suitable for consumption by lighting elements 38A-38P.

In the depicted embodiment, power converter 36 provides the low-voltage DC power suitable for consumption by lighting elements 38A-38P on conductor 44. In the depicted embodiment, the converted low-voltage DC power provided to conductor 44 is referenced to power reference REF of conductor 42. Conductors 43 and 44 provide the converted low-voltage DC power to each of lighting elements 38A-38P. In some embodiments, the converted low-voltage DC power will have an isolated reference, independent of power reference REF of conductor 43. In such embodiments, an additional conductor will provide the isolated reference voltage to lighting elements 38A-38P. In such embodiments, the additional conductor along with conductor 44 can provide the converted low-voltage DC power to each of lighting elements 38A-38P.

Lighting elements 38A-38P are identical to one another in the depicted embodiment. Lighting elements 38A-38P are wired in daisy chain fashion from the data-in contact of first connector 34 to the data-out contact of second connector 40 via data-in DI and data-out DO ports of lighting elements 38A-38P. First connector 34 receives illumination control data on the data-in contact of first connector 34. The received illumination control data can independently control the illumination of each of lighting elements 38A-38P, as well as independently controlling lighting elements of one or more decorative LED light strings attached to second connector 40. The received illumination control data may include brightness control, color control, and/or temporal control (e.g., flashing or other temporal lighting variations).

Each of daisy-chained lighting elements 38A-38P receives the illumination control data at data-in port DI. Each of daisy-chained lighting elements 38A-38P then process the received illumination control data and control the illumination based on the received illumination control data. The received illumination control data includes data corresponding to the lighting element that receives the data as well as data corresponding to lighting elements downstream the daisy chain of lighting elements from the lighting element that receives the data. Thus, each of the daisy-chained lighting elements 38A-38P transmits at least some of the received illumination data to downstream lighting elements via the data-out port DO of the lighting element.

Figure 3:
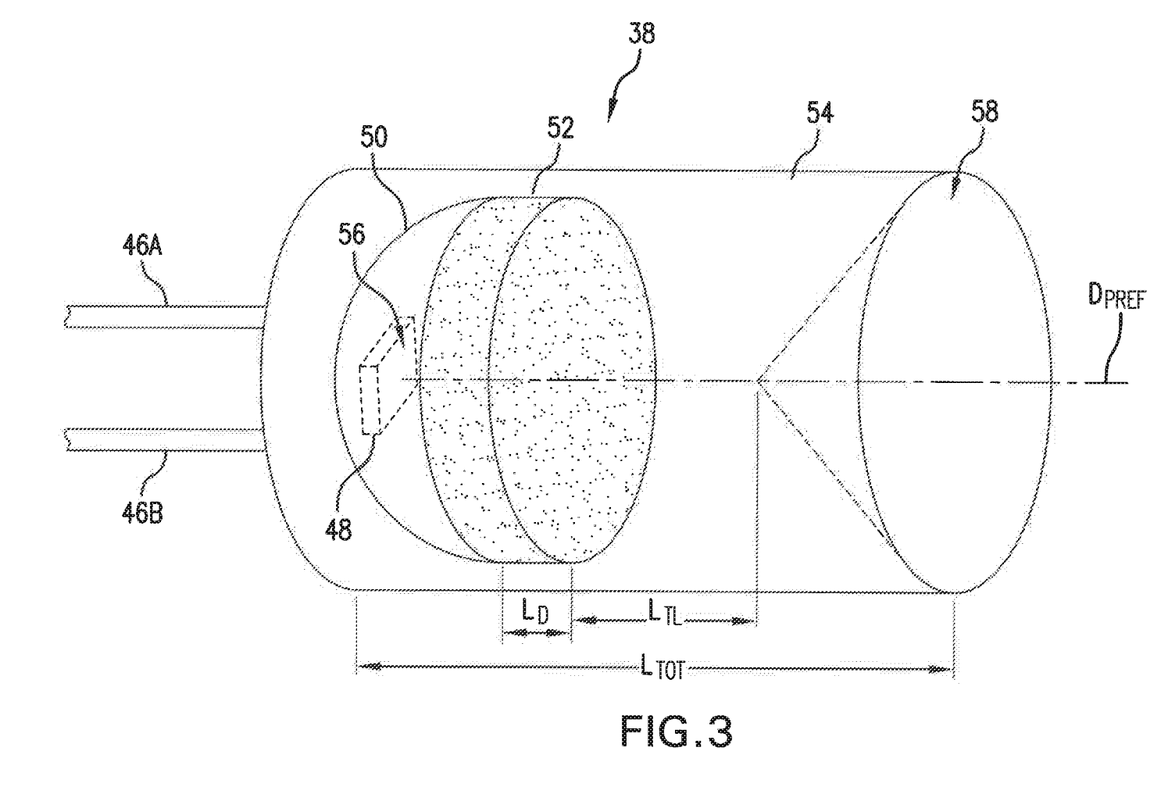
FIG. 3 is a schematic view of an embodiment of a single lighting element having a diffuser between an LED and a transparent lens.

FIG. 3 is a schematic view of an embodiment of a single lighting element having a diffuser between an LED and a transparent lens. In FIG. 3, decorative lighting element 38 includes electrical leads 46A and 46B, LED 48, reflector cup 50, diffuser 52 and transparent lens 54. In the depicted embodiment, leads 46A and 46B are configured to provide operating power to decorative lighting element 38. In some embodiments electrical leads 46A and 46B can also provide control signals to decorative lighting element 38. Various embodiments can have more than two electrical leads, and can use various protocols for providing operating power and/or control signals to decorative lighting element 38.

LED 48 is configured to emit light of an emission spectrum corresponding to a predetermined color. In some embodiments, LED 48 can be color controllable so as to emit a particular color of light in corresponding to an electrical command received by electrical leads 46A and 46B. The various colors that LED 48 is capable of emitting can substantially span the visible spectrum of light (e.g., 0.4 through 0.7 micron wavelengths), for example. LED 48 can be further configured to emit light according to an emission pattern with a preferential direction $D_{PREF}$ of emission aligned with axis $D_{PREF}$. The preferential direction of emission is defined as the direction corresponding to a maximum of the emission pattern.

Reflector cup 50 is configured to reflect any light incident thereupon in directions within the semicircle of $2\pi$ steradian solid angles centered on axis $D_{PREF}$. Various embodiments can have various geometries of reflector cup 50 or can have no reflector cup at all.

Diffuser 52 is located between transparent lens 54 and LED 48. In some embodiments, diffuser 52 is formed by filling reflector cup 50 with a liquid resin that will later solidify into diffuser 52. In other embodiments, diffuser 52 is formed by providing such a liquid resin directly upon LED 48. In still other embodiments, diffuser 52 can be provided in a solid form. In some embodiments, diffuser 52 will engage substantially-planar top surface 58 of LED 48. In some embodiments, diffuser 52 will cover at least a predetermined fraction of substantially-planar top surface 56, including most or all of an emitting region of substantially-planar top surface 56. For example, in various embodiments, diffuser 52 can cover more than 50%, 66%, 75%, 80% or 90% of substantially-planar top surface 56.

Diffuser 52 is configured to scatter light emitted by LED 48 so as to provide more homogeneous projection profile of light to the external atmosphere. Thus, the light emerging from diffuser 52 can be of a diffusion pattern in which the light projected in the preferential direction is less than 90%, 80%, 70% or 50% of the light emitted by LED 48 in the preferential direction according to the emission pattern. Similarly, the light emerging from diffuser 52 can be of a diffusion pattern in which the light projected in non-preferential directions are greater than 200% of the light emitted by LED 48 in such non-preferential directions according to the emission pattern.

Although, diffuser 50 is configured to scatter the light emitted by LED 48, it is configured to substantially maintain (e.g., not substantially change) the color of the light emitted by LED 48. The emitted color of light is maintained so that the controlled colors of the LED can span most or all of the controllable range of colors through which the LED is capable. Such color maintenance can be achieved by using a diffuser that has a substantially constant absorption coefficient (and preferably of a low value—e.g., less than 0.5) throughout the controllable range of colors. Therefore, diffuser 50 has an absorption coefficient that is substantially constant throughout the emission spectrum so as not to substantially change the predetermined color of the emitted light as it is scattered by diffuser 50. The substantially constant absorption coefficient can be within +/−0.03, 0.05, 0.1, or 0.2, for example, throughout the emission spectrum corresponding to the predetermined color.

In addition to maintaining the emitted color, diffuser 50 can mix the colors emitted by LED 48. Some color-controllable LEDs include two or more individual LED elements, each of a different color. These two or more individual LEDs are located adjacent to one another. Thus, a user who is located nearby the LED can sometimes see the individual colors emitted by the individual LED elements. By scattering the light emitted by each of the individual LED elements, diffuser 50 mixes the light of the various colors emitted by the individual LED elements.

Diffuser 50 can span length $L_D$ along axis $D_{REF}$. Length $L_D$ can be a small fraction of a total length $L_{TOT}$ of decorative lighting element 38. For example, in various embodiments, the ratio of $L_{TL}$ to $L_{TOT}$ can be less than 50%, 33%, 25% or 15%. The small fraction of $L_{TOT}$ spanned by diffuser 50 can facilitate the glass-bulb-like appearance of transparent lens 52.

Transparent lens 54 is depicted as being of a cylindrical shape with a concave end aligned with axis $D_{PREF}$. Various embodiments can have transparent lenses of various shapes. Transparent lens extends along axis $D_{PREF}$ for a length $L_{TL}$, so as to visibly appear like a glass bulb to a viewer. Length $L_{TL}$ can be a significant fraction of a total length $L_{TOT}$ of decorative lighting element 38. For example, in various embodiments, the ratio of $L_{TL}$ to $L_{TOT}$ can be greater than 30%, 50%, 66% or 75%. Length $L_{TL}$ can also be a significant greater than length $L_D$ spanned by diffuser 52 along axis $D_{PREF}$. For example, in various embodiments, the ratio of $L_{TL}$ to $L_D$ can be greater than 2, 3, 5 or 10.

Transparent lens 54 has exterior surface 58 configured to refract the light transmitted therethrough into an external atmosphere according to a refraction pattern. Refraction by transparent lens 54 can provide further homogenization of light projected into the external atmosphere. Thus, the light emerging from exterior surface 58 of transparent lens 54 can be of a refraction pattern in which the light projected in the preferential direction is less than 90%, 80%, 70% or 50% of the light diffused by diffuser 50 in the preferential direction according to the diffusion pattern.

In some embodiments one of both of diffuser 52 and transparent lens 54 can comprise one of the group consisting of polymethylmethacrylate, acrylic, polycarbonate, cyclic olefin copolymer, polymethacrylmethylimid, and optical silicone resin.

Figure 4:
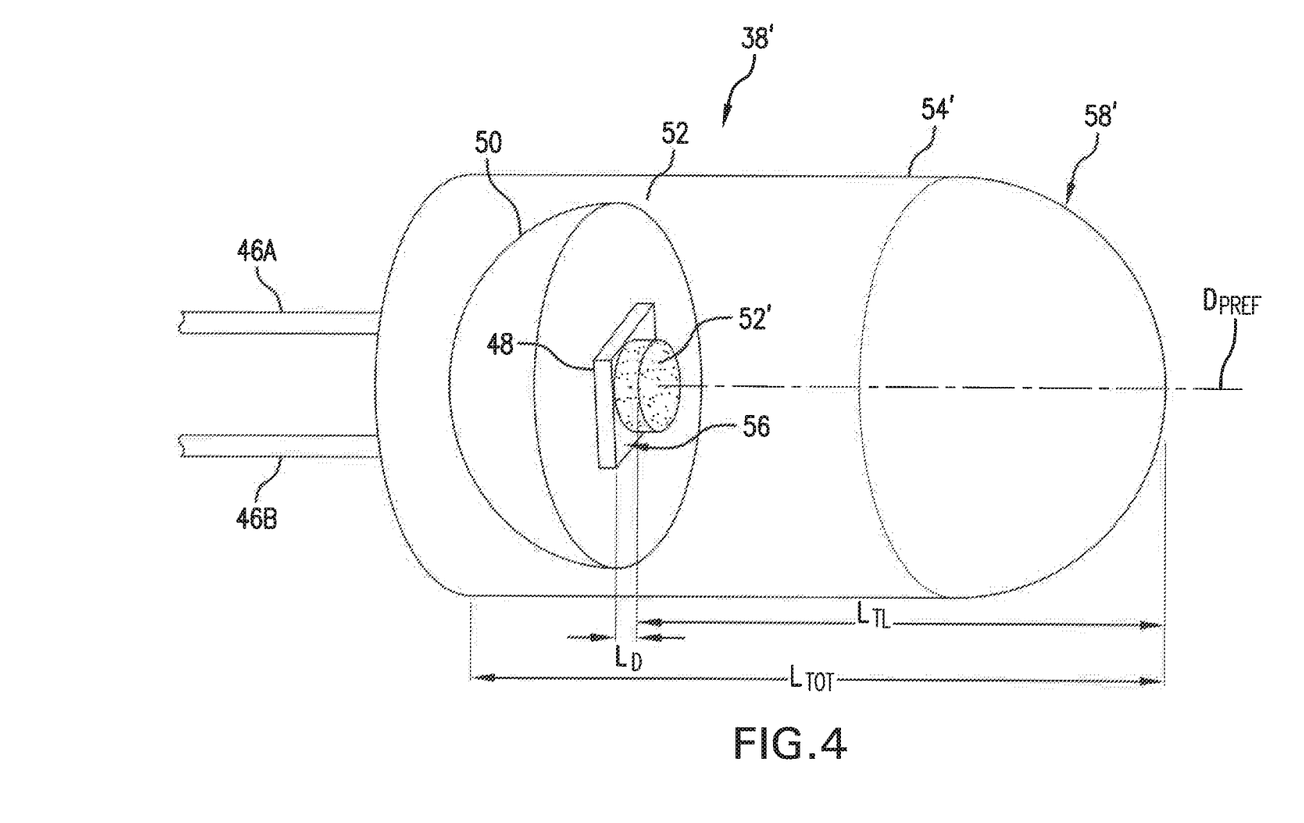
FIG. 4 is a schematic view of an embodiment of a single lighting element having a diffuser engaging and substantially covering an LED.

FIG. 4 is a schematic view of an embodiment of a single lighting element having a diffuser engaging and substantially covering an LED. In FIG. 4, decorative lighting element 38' includes electrical leads 46A and 46B, LED 48, reflector cup 50, diffuser 52' and transparent lens 54'. Decorative lighting element 38' depicted in FIG. 4 differs from that depicted in FIG. 3 only in the shapes of diffuser 52' and transparent lens 54'. Specifically, diffuser 52' is engages and substantially covers planar surface 56 of LED 48, but doesn't significantly extend therebeyond. Transparent lens 54' has a cylindrical shape with a convex end aligned with axis $D_{PREF}$. The FIG. 4 embodiment is provided as an example of another of the various geometries possible for such a decorative lighting element.

Figure 5:
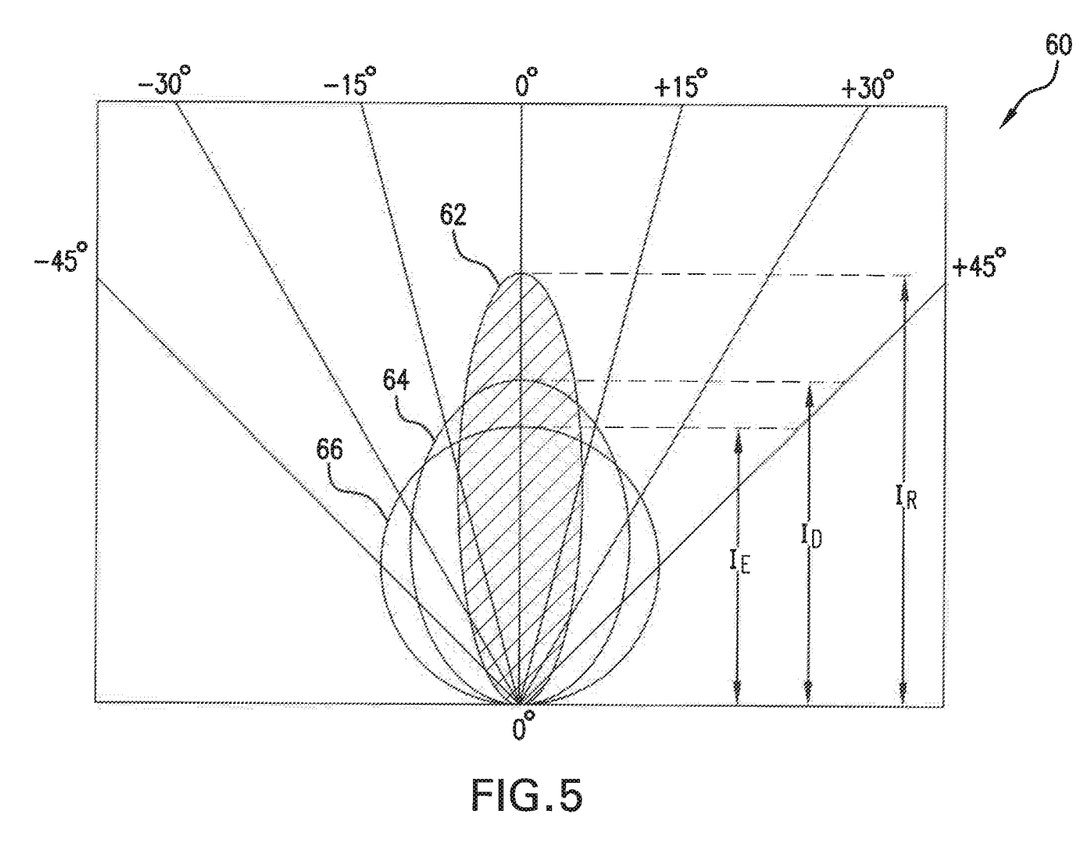
FIG. 5 is a graph of emission, diffusion, and refraction patterns of an embodiment of a lighting element having a diffuser between an LED and a transparent lens.
Figure 6A:
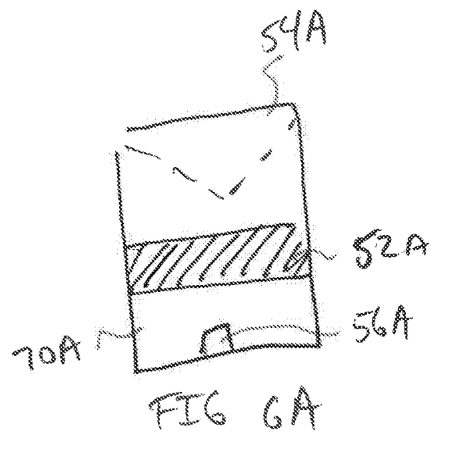
FIGS. 6A-6E depict side elevation views of decorative lighting elements having various diffuser/LED configurations.
Figure 6B:
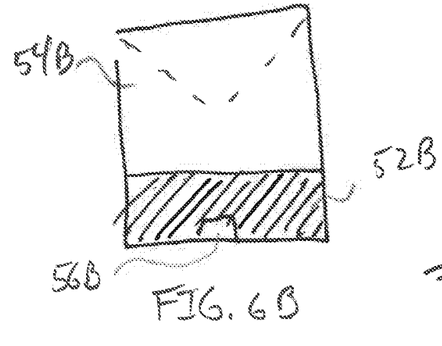
Figure 6C:
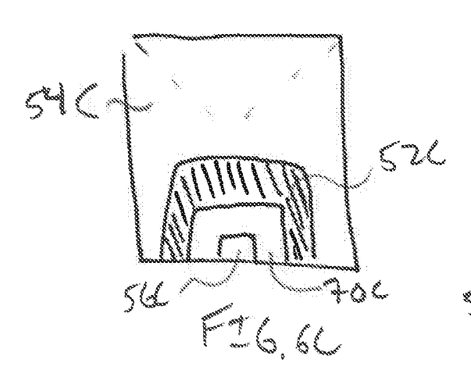
Figure 6D:
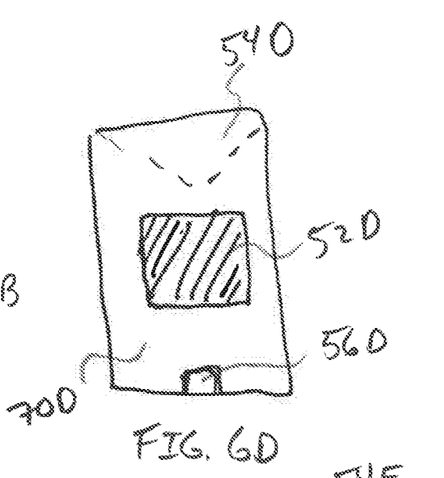
Figure 6E:
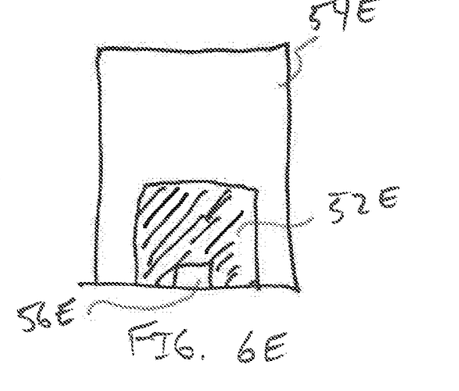

FIG. 5 is a graph of emission, diffusion, and refraction patterns of an embodiment of a lighting element having a diffuser between an LED and a transparent lens. In FIG. 5, graph 60 depicts intensity of projected light as a function of angle. Graph 60 includes origin O, and direction lines having angles +/−0, 15, 30 and 45 degrees with respect to a preferential direction of emission of 0 degrees. Graph 60 also includes emission pattern 62, diffusion pattern 64, and refraction pattern 66. Emission pattern 62 depicts the intensity of light emitted by LED 38 (depicted in FIGS. 3-4). Note that emission pattern 62 depicts a pattern in which most of the light emitted by LED 38 is within =1-15 degrees of the preferential direction of emission.

Diffusion pattern 64 depicts the intensity of light emerging from diffuser 52 (depicted in FIGS. 3-4). Note that the intensity of light, as indicated by diffusion pattern 64, projecting in the preferential direction of emission is less than the intensity of light, as indicated by emission pattern 62 projecting in the preferential direction of emission.

Refraction pattern 66 depicts the intensity of light emerging from transparent lens 54 (depicted in FIGS. 3-4). Note that the intensity of light, as indicated by refraction pattern 66, projecting in the preferential direction of emission is less than the intensity of light, as indicated by diffusion pattern 64 projecting in the preferential direction of emission. Refraction pattern 66 is indicative of light projecting from transparent lens 54 into the exterior atmosphere.

FIGS. 6A-6E depict side elevation views of decorative lighting elements having various diffuser/LED configurations. As disclosed above with reference to FIG. 3, in some embodiments, such as those depicted in FIGS. 6B and 6E, diffusers 52B and 52E are in direct contact with LEDs 56B and 56E, respectively. In other embodiments, such as those depicted in FIGS. 6A, 6C and 6D, diffusers 52A, 52C and 52D are not in direct contact with LEDs 56A, 56C and 56D, respectively. In these embodiments depicted in FIGS. 6A, 6C and 6D, transparent lens portions 70A, 70C and 70D are formed between diffusers 52A, 52C and 52D are in direct contact with LEDs 56A, 56C and 56D, respectively. Diffusers 52A, 52C and 52D are configured so as to receive a majority of the light emitted by projected by LEDs 56A, 56C and 56D, respectively. For example, diffusers 52A, 52C and 52D can be configured to receive at least 66%, 75%, 80%, 90% or 95% of the light projected from LEDs 56A, 56C and 56D, respectively.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A lighting element for a decorative lighting display, the lighting element comprising:
    a Light-Emitting Diode (LED) having a substantially planar surface and configured to emit light of an emission spectrum corresponding to a predetermined color, the LED further configured to emit light according to an emission pattern with a preferential direction of emission, the preferential direction of emission being the direction corresponding to a maximum of the emission pattern;
    a first transparent lens portion engaging the substantially planar surface of the LED and configured receive the light emitted according to the emission pattern;
    a diffuser engaging the first transparent lens portion and configured receive the light emitted according to the emission pattern and to scatter the received light according to a diffusion pattern, the light scattered in the preferential direction according to the diffusion pattern being less than 80% of the light emitted in the preferential direction according to the emission pattern, wherein the diffuser has an absorption coefficient that is substantially constant throughout the emission spectrum so as not to substantially change the predetermined color of the emitted light as it is scattered by the diffuser, wherein the substantially constant absorption coefficient is within +/−0.1 throughout the emission spectrum corresponding to the predetermined color; and
    a second transparent lens portion coupled to the diffuser so as to receive the light scattered by the diffuser and to transmit the received light therethrough.

2. The lighting element of claim 1, wherein the diffuser has a first dimension as measured along the preferential direction, and the second transparent lens portion has a second dimension as measured transverse to the preferential direction, the second dimension being greater than the first dimension.

3. The lighting element of claim 1, wherein the substantially-planar surface has a normal vector parallel to the preferential direction of emission.

4. The lighting element of claim 3, wherein the diffuser is configured to receive at least 80% of the light emitted by the LED.

5. The lighting element of claim 1, further comprising:
a concave reflection cup in which the LED is located.

6. The lighting element of claim 5, wherein at least a portion of the diffuser is located within the concave reflection cup.

7. The lighting element of claim 1, wherein the second transparent lens portion has an exterior surface configured to refract the light transmitted therethrough into an external atmosphere according to a refraction pattern.

8. The lighting element of claim 7, wherein the light refracted in the preferential direction according to the refraction pattern is less than 80% of the light scattered in the preferential direction according to the diffusion pattern.

9. The lighting element of claim 1, wherein the LED is a color-controllable LED.

10. The lighting element of claim 1, wherein the light scattered in the preferential direction according to the diffusion pattern is less than 50% of the emitted light in the preferential direction according to the emission pattern.

11. The lighting element of claim 1, wherein the substantially constant absorption coefficient is within +/−0.05 throughout the emission spectrum corresponding to the predetermined color.

12. A decorative LED light string comprising:
a plurality of lighting elements distributed along the decorative light string, each of the plurality of lighting elements including:
a Light-Emitting Diode (LED) having a substantially planar surface and configured to emit light of a predetermined color, the LED further configured to emit light according to an emission pattern with a preferential direction of emission, the preferential direction of emission being the direction corresponding to a maximum of the emission pattern;
a first transparent lens portion engaging the substantially planar surface of the LED and configured receive the light emitted according to the emission pattern
a diffuser engaging the first transparent lens portion and configured receive the light emitted according to the emission pattern and to scatter the received light according to a diffusion pattern, the light scattered in the preferential direction according to the diffusion pattern being less than 80% of the emitted light in the preferential direction according to the emission pattern,
wherein the diffuser has an absorption coefficient is substantially constant throughout the emission spectrum so as not to substantially change the predetermined color of the emitted light as it is scattered by the diffuser, wherein the substantially constant absorption coefficient is within +/−0.1 throughout the emission spectrum corresponding to the predetermined color;
and
a second transparent lens portion coupled to the diffuser so as to receive the light scattered by the diffuser and to transmit the received light therethrough.

13. The decorative LED light string of claim 12, wherein each the LED of each of the plurality of lighting elements has a substantially-planar surface having a normal vector parallel to the preferential direction of emission.

14. The decorative LED light string of claim 13, wherein the diffuser of each of the plurality of lighting elements is configured to receive at least 80% of the substantially-planar surface of the LED.

15. The decorative LED light string of claim 12, wherein each of the plurality of lighting elements further includes:
a concave reflection cup in which the LED is located.

16. The decorative light string of claim 15, wherein at least a portion of the diffuser of each of the plurality of lighting elements is located within the concave reflection cup.

17. The decorative LED light string of claim 12, wherein the second transparent lens portion has an exterior surface configured to refract the light transmitted therethrough into an external atmosphere according to a refraction pattern.

18. The decorative LED light string of claim 17, wherein the light refracted in the preferential direction according to the refraction pattern is less than 80% of the light emitted by the LED.

19. The decorative LED light string of claim 12, wherein the LED of each of the plurality of lighting elements is a color-controllable LED.

* * * * *